United States Patent [19]
Weimer

[11] 3,986,176
[45] Oct. 12, 1976

[54] CHARGE TRANSFER MEMORIES

[75] Inventor: Paul Kessler Weimer, Princeton, N.J.

[73] Assignee: RCA Corporation, New York, N.Y.

[22] Filed: June 9, 1975

[21] Appl. No.: 585,410

[52] U.S. Cl. ..................... 340/173 DR; 340/173 R; 307/238
[51] Int. Cl.² ........................................... G11C 7/00
[58] Field of Search............... 340/173 CA, 173 DR, 340/173 RC, 173 R, 173 FF; 307/238

[56] References Cited
UNITED STATES PATENTS

| | | | |
|---|---|---|---|
| 3,506,851 | 4/1970 | Polkinghorn et al. ........ | 340/173 DR |
| 3,646,525 | 2/1972 | Linton et al. ................. | 340/173 DR |
| 3,713,114 | 1/1973 | Linton et al. ................. | 340/173 DR |
| 3,800,295 | 3/1974 | Anderson, Jr. et al. ....... | 340/173 DR |
| 3,891,977 | 6/1975 | Amelio et al. ................ | 340/173 R |

Primary Examiner—Thomas A. Robinson
Attorney, Agent, or Firm—H. Christoffersen; Samuel Cohen

[57] ABSTRACT

Charge transfer memories such as those of the bucket-brigade or of the charge-coupled device (CCD) type include, at each location, a store which is separate from the normal means for charge storage. Charge is transferred from the normal means of storage to the separate store at each location during a first period of time and may be sensed during later intervals of time to provide multiple "copies" of the stored information. In one form of such a memory especially suitable for the storage of digital data, each separate store includes an internal loop for refreshing the charge. In other forms of such memories, means are provided for reducing the effects of variation in threshold voltage from location-to-location of the transistors associated with the separate stores. These are especially suitable for analog storage.

21 Claims, 13 Drawing Figures

CHARGE TRANSFER MEMORIES

Charge transfer memories currently under development and some of which are already commercially available store information directly at each location. In charge coupled device (CCD) memories, for example, charge is stored in depletion regions in a semiconductor substrate. In so-called bucket brigade memories, charge is stored in capacitors (which may be the distributed capacitances) between the drain and gate electrodes of MOS transistors. Multiple readouts and long storage times are obtained by recycling the sequential output signlas from the memory back to the input circuit to the memory through an external regeneration stage. The requirement for recycling complicates the design of the array and may in some cases be a deterrent to the use of such memories in certain forms of computer architecture. Moreover, in the case of the storage of analog signals, the recycling procedure can be used only a limited number of times because of the loss in resolution caused by the large number of charge transfers during the recycling process.

It has been proposed that external recycling can be eliminated and nondestructive readout obtained by using a separate memory element for each charge storage location (M. H. White et al, "A Non-volatile Charge-Addressed Memory," Technical Digest, Int. Electron Devices Meeting, Dec. 9 – 11, 1974, Page 115). The memory element employed is a double insulator MNOS transistor for each CCD location. Although such transistors are capable of unlimited storage times, they still exhibit serious technological problems even after many years of research. Moreover, such memory elements are not desirable for analog memory arrays because of non-uniformities caused by local variations in transistor threshold voltage and gate capacitance.

The charge transfer memories according to various embodiments of the present invention employ at each location a store which is separate from the normal means at that location for charge storage. However, the storage element of the store may be a more conventional form of capacitance. In one embodiment of the invention, there is recirculation at each charge transfer location. In other embodiments of the invention, means are provided for duplicating the stored charge while compensating for non-uniformities caused by variations in threshold voltage and capacitance from one element to the next. These and other forms of the inventions are discussed in greater detail below.

In the drawing

Figure 1:
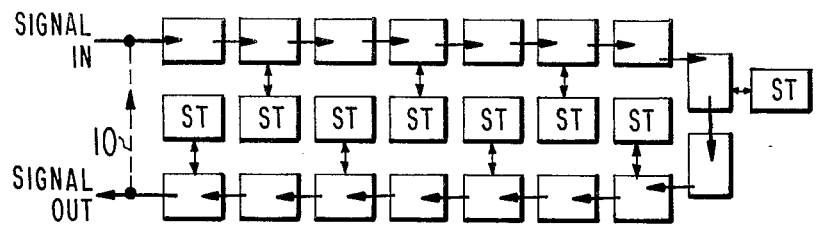
FIGS. 1–3 are block diagrams of three different forms of memory embodying the invention.
Figure 2:
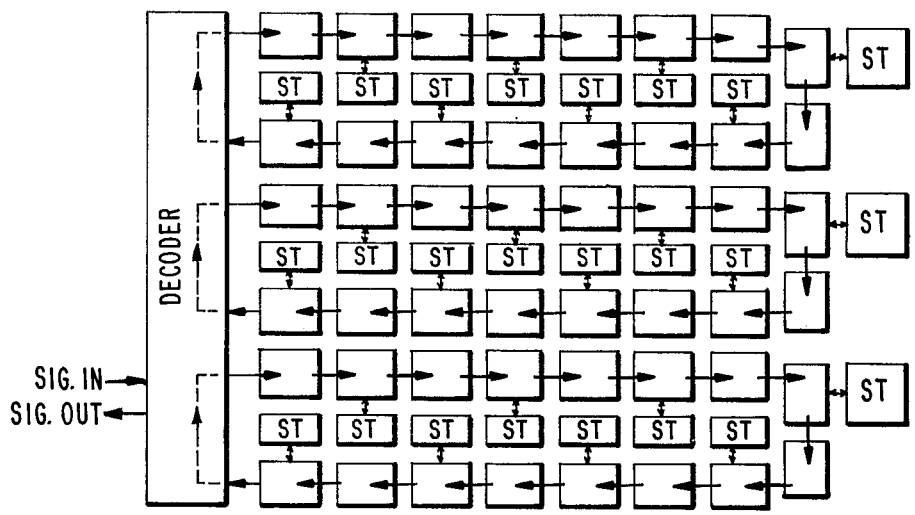
Figure 3:
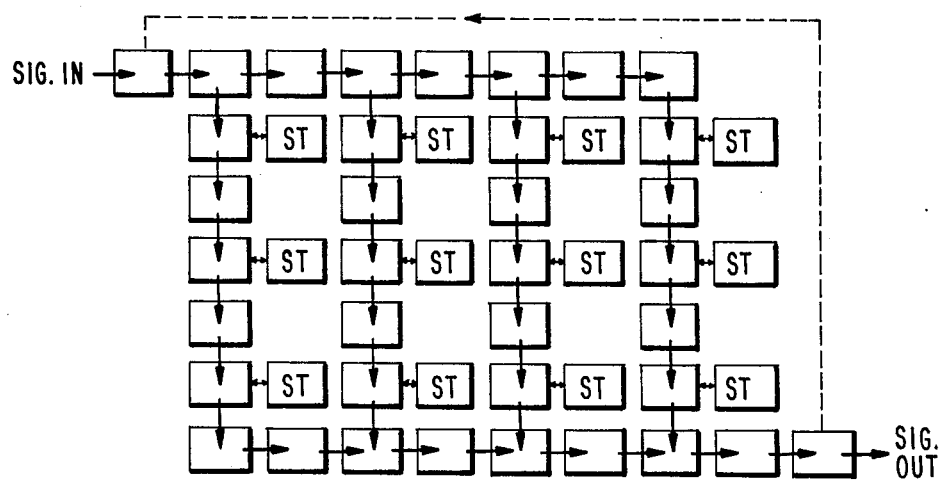

FIGS. 1, 2 and 3 illustrate, by way of example, three different memory organizations in which the present invention can be embodied. The system of FIG. 1 is a simple serial memory, i.e. in the form of a register, the dashed line 10 indicating a recycling connection which is optional. The blank blocks in this figure and in FIGS. 2 and 3 represent charge transfer elements and in the particular organization of FIG. 1 two such blocks constitute one charge storage stage. The FIG. 1 system, in other words, is a two-phase operated register. In a two-phase CCD register, each block can represent an electrode means having a geometry such as to produce an asymmetrical potential well in the substrate in response to an applied voltage. The two phase signals are implied but not shown specifically. The separate stores associated with the respective charge transfer stages are legended ST. In FIG. 1 to save space these stores are interleaved with one another for the most part. Details of the structure of the stores ST and how they are connected to the charge transfer stages are given later.

In the operation of the system of FIG. 1, input signals are sequentially applied to the charge transfer register and are shifted down the register by applying two-phase voltages to the transfer gates in conventional fashion. When the register is filled, the charge signals are transferred to the stores ST associated with the respective charge transfer stages. During the storage period of stores ST, the signal can be read non-destructively from stores ST back to the charge transfer register and then read out of the charge transfer register in serial fashion by applying two-phase voltages to the transfer gates. The signals can be digital or analog in nature. The storage time may be from milliseconds to minutes or more depending upon the design. In one form of the invention especially suitable for the storage of binary information, regeneration may be provided within each store ST to extend indefinitely the storage time.

The organization shown in FIG. 2 is suitable for a word organized computer memory with random read/write access to each register, three of which are illustrated. It also may be used as an analog storage array for image storage applications, such as television.

The so-called series-parallel-series system illustrated in FIG. 3 is particularly suitable for television frame storage.

Figure 11:
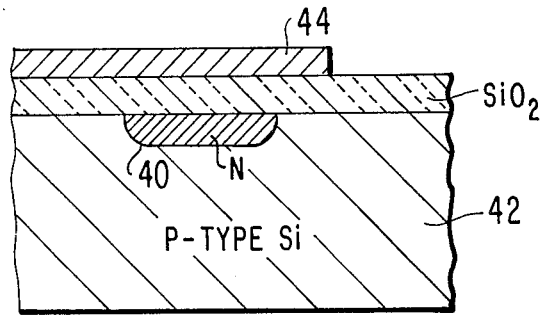
FIG. 11 is a cross-sectional view through a capacitance of the type which can be used in the circuits of the present application.

The remaining figures are circuit diagrams of storage locations and the waveforms obtained during operation of such locations. It is assumed that the various transistors and capacitors of each circuit are integrated onto a common substrate. N channel MOS transistors are illustrated; however, it is to be understood, of course, that P channel devices could be used instead with appropriate modification of voltage polarities. The capacitors illustrated (a typical one being shown in cross-section in FIG. 11) may be formed between a diffusion 40 in the substrate 42 of opposite conductivity than the substrate and an overlying conductor 44 such as one formed of polysilicon, or of a metal, which is insulated from the substrate and diffusion. Most of the figures illustrate the invention in terms of charge transfer circuits of the bucket-brigade type. However, it is to be understood that the invention is equally applicable to charge transfer circuits of the charge coupled device (CCD) type.

Figure 4:
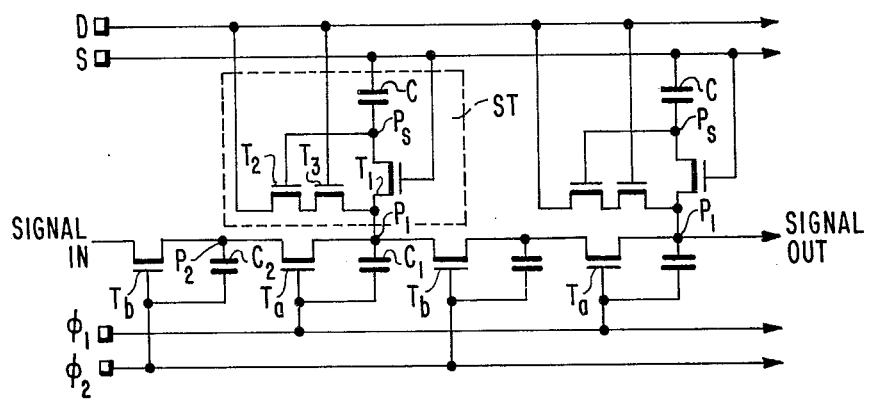
FIG. 4 is a schematic circuit diagram of two storage locations according to one embodiment of the present invention.

FIG. 4 illustrates one form of store ST which may be employed in the systems of the preceding figures. It includes three transistors $T_1$, $T_2$ and $T_3$ and a capacitor C. One such store is associated with each stage of a bucket brigade shift register. For purposes of the present discussion, a two phase register is assumed and such a register includes two transistors $T_a$ and $T_b$ and two capacitors $C_1$ and $C_2$ per stage.

The components of each store ST are interconnected in the following way. The source-drain path of transistor $T_1$ is connected between node $P_1$ of the bucket brigade register and node $P_S$ at one terminal of capacitor C. The other terminal of capacitor C is connected to bus S as is the gate electrode of transistor $T_1$. The conduction path of transistors $T_2$ and $T_3$ are connected in series between node $P_1$ and bus D. The gate electrode of transistor $T_3$ is connected to bus D; the gate electrode of transistor $T_2$ is connected to node $P_S$.

Figure 5:
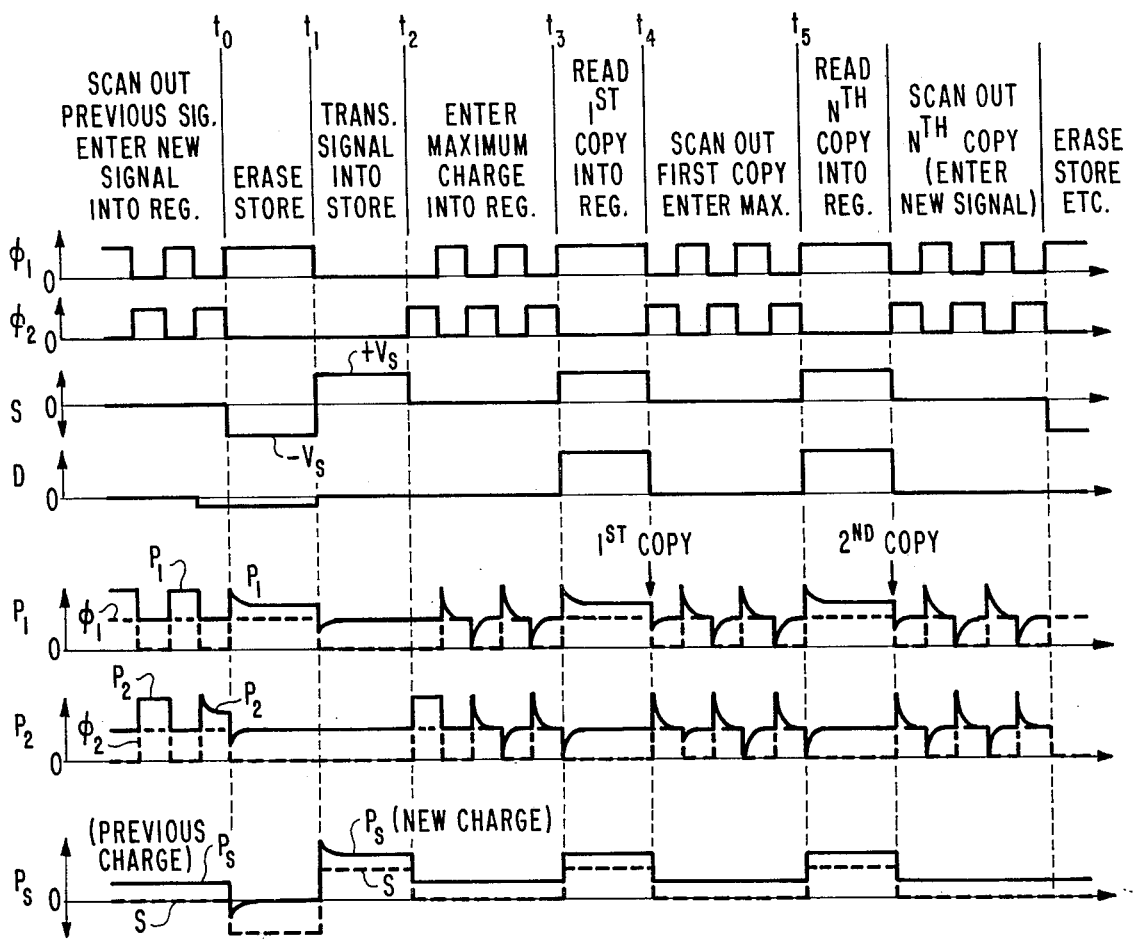
FIG. 5 is a drawing of waveforms present in the circuit of FIG. 4.

The operation of the circuit of FIG. 4 is illustrated by the waveforms of FIG. 5. It may be assumed to start with that the previous contents of the bucket brigade register have been shifted out of the register and a new train of signals entered therein. Immediately before the time $t_o$, $\phi_1$ is relatively negative (actually at ground) and $\phi_2$ positive. Transistors $T_a$ were off and transistors $T_b$ were on. At time $t_o$, $\phi_1$ goes high (positive) and $\phi_2$ goes low (to ground). when $\phi_1$ goes high turning on transistor $T_a$, any electrons at node $P_2$ transfer to node $P_1$, making $P_1$ less positive.

During the time $t_o-t_1$, the store ST is erased. The erasure is accomplished by making S negative to cause charge (electron) injection into the substrate. D is made slightly negative to ensure that $T_3$ is cutoff in case its threshold is exceptionally low. When S goes negative, transistor $T_1$ is kept off and the terminal of capacitor C connected to bus S is driven to a negative voltage level. The excess electrons stored in the diffusion forming the other "plate" of the capacitor (the one at $P_S$) are thus "injected" into the substrate, that is, node $P_S$ is discharged to substrate potential. As D is slightly negative during this time, the path from $P_1$ to D is cut off and the charge stored at $P_1$ remains unchanged.

During the time $t_1-t_2$, charge is transferred from the nodes $P_1$ to the nodes $P_S$. This is accomplished by making $\phi_1$ relatively negative so that the transistors $T_a$ (as well as the transistors $T_b$) in the bucket-brigade register are cut off. This prevents any charge transfer down the bucket brigade register while the transfer of charge into the store ST is taking place. At the same time it makes the "plate" of capacitor $C_1$ connected to the $\phi_1$ bus more negative, driving $P_1$ more negative to cause the transfer to be described below to take place. S goes positive turning on transistor $T_1$. (Note the voltage change of $2V_S$ from value $-V_S$ to a value $+V_S$.) This positive voltage is also applied to the terminal of capacitor C connected to bus S so that it and node $P_S$ are driven positive (both plates of capacitor C increase in potential; however, $P_S$ increases in potential from ground to $2V_S$). The charge (electrons) present at node $P_1$ now transfers via the conduction path of transistor $T_1$ to node $P_S$ Thus node $P_S$ becomes less positive and node $P_1$ more positive (returns to $+V_S$ potential).

At time $t_2$, S returns to ground cutting off transistor $T_1$ and isolating the charge present at $P_S$. D is at ground at this time keeping transistor $T_3$ cut off. $P_S$ is relatively positive. Just before $t_2$, $V_S$ was at a level $2V_S$ minus the negative charge packet transferred to $P_1$. Just after $t_2$, the decrease in voltage at S from $+V_S$ to 0 results in a corresponding drop of $V_S$ in the level of the voltage at $P_S$. Accordingly, transistor $T_2$ is in a conducting condition; however, no current flows through this transistor in view of the cut-off condition of transistor $T_3$.

Starting at time $t_2$, charge signals of "maximum" size are entered into the bucket brigade register. How large "maximum" actually needs to be may be understood by considering the following. The largest charge which can be carried by a charge transfer register is defined as that just sufficient to fill the "potential well" or "bucket" without driving the storage region into an accumulation or a forward-bias condition where the signal would be lost into the substrate. In the N-MOS bucket brigade circuits of FIG. 4 and following, the largest electron charge which can be carried would be just sufficient to lower the potential of a node by $V_S$ volts, assuming all nodes had the same capacitance. In operation of FIG. 4, the fixed "maximum" charge which must entered into the register for readout purposes need be no larger than the maximum stored charge which is to be copied. This statement applies whether the system is being used for duplication of digital or analog signals.

When all stages of the bucket brigade register are storing maximum charge, the reading of the first copy out of the store ST and back into the register begins. This starts at time $t_3$. At this time, S goes high and D goes high (D more positive than S). At this time S is switched positive to $+V_S$ potential and D to a still more positive potential $+2V_S$. At the same time, $\phi_1$ is switched to $+V_2$ potential and $P_1$ is momentarily charged to $+2V_S$ potential. Although the gate of transistor $T_1$ is now at $+V_S$ potential, this transistor does not turn on since both its source electrode (node $P_S$) and its drain electrode (node $P_1$) are more positive than its gate electrode. The stored charged at $P_S$ therefore remains unchanged. However, when D goes positive, transistor $T_3$ turns on as soon as $P_1$ drops slightly below $+2V_S$, and D operates as a drain for electrons.

When S goes positive, it makes node $P_S$ more positive by a corresponding amount. $P_S$ already is positive in an amount inversely proportional to the charge it is storing. Accordingly, transistor $T_2$ and transistor $T_3$ both go on. When they do, transistor $T_2$ conducts to an extent inversely proportional to the charge (the number of electrons) being stored in capacitor C (at node $P_S$). As transistors Ta, $T_2$ and $T_3$ are on, capacitor $C_2$ discharges through this path to bus D and the amount of discharge is inversely proportional to the charge stored at $P_S$. node $P_1$ loses to bus D a number of electrons such that there remains at node $P_1$ the same charge as initially transferred to node $P_S$.

The potential of $P_2$, which was initially at zero volts at the time $t_3$, has risen to $+V_S$ volts at $t_4$, the end of the "read" period, and the potential at $P_1$ has been lowered to the same potential as $P_S$ by virtue of the source-follower action of transistor $T_2$ (zero threshold voltage assumed here). In brief, a "copy" has been made of the charge stored in C. This copy is made in the period $t_3$ to $t_4$ and may be scanned out during the period $t_4$ to $t_5$ by the application of the multiple phase voltages $\phi_1$, $\phi_2$.

Note that while only a few shift periods are shown in $t_4$–$t_5$ (and in $t_2$–$t_3$) this is intended to represent the greater number of periods required to scan out (and fill) the register, the actual number of such periods in each case, depending upon the length of (the number of stages in) the register.

During the operation discussed above, both the writing of signal into the store and the reading of each copy are source-follower charge transfer operations and this makes for linear reproduction of analog signals. Although the readout of signals does not disturb the stored charge, the total period over which useful copies can be made is limited by the leakage of charge from the storage capacitor C through the "off" transistor $T_1$. This storage time, in general, is not greatly different from the storage time of the capacitors in the bucket brigade register. Assuming silicon technology and using carefully processed silison, the storage at C can be for a period of from a fraction of a second up to perhaps a minute or more at room temperature. If longer term storage is needed, the charges can be recycled externally, refreshing them in the process, and then returning them to the stores ST, such recycling taking place before the stored charge has been seriously degraded. Alternatively, simply by cooling to a sufficiently low temperature, hours of storage can be obtained, without requiring external recycling.

The number of copies which can be made depends upon the maximum storage time as discussed above. FIG. 5 illustrates only the making of the first and the N'th copies, it being understood that N may be some reasonably large number such as 10 or 50 or 100, depending upon the size of the register (which determines the total time required to make each copy) and the maximum storage time at node $P_S$. After the desired number of copies are made, the stores ST are erased in the manner already described and new charge signals entered into the bucket brigade register also as already described. An advantage of the arrangement of FIG. 4 over simply continuously recycling the charge in the bucket brigade register from the output circuit of the register back to the input circuit of the register is that there is no transfer loss in the arrangement of FIG. 4 due to the successive recycling of the signals.

Figure 6:
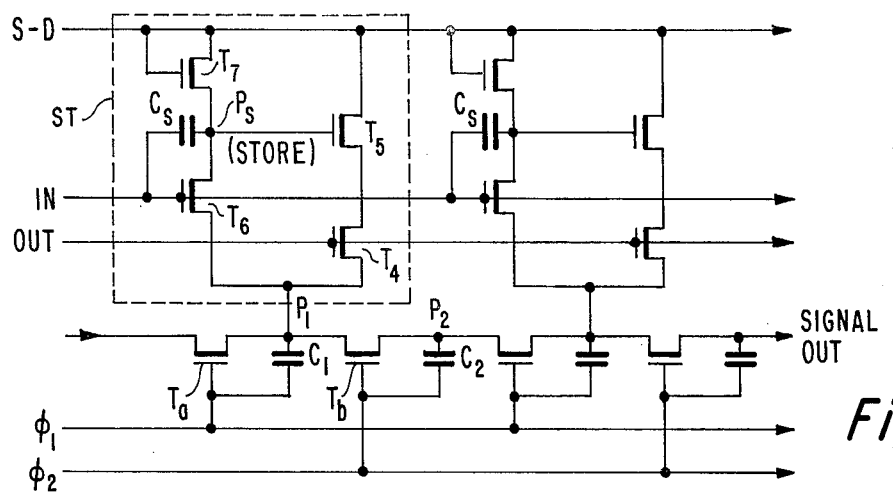
FIG. 6 is a schematic circuit diagram showing a number of storage locations in accordance with a second embodiment of the invention.

FIG. 6 illustrates a circuit which is especially suitable for the storage of digital information and in which the storage time can be as long as desired. A feature of the circuit of FIG. 6 is that there is a complete recirculation loop at each location and it is possible continuously to refresh the stored information at each location without the need for external recycling of the data stored in the bucket brigade register.

The circuit ST of FIG. 6 includes four transistors $T_4$ – $T_7$, a capacitor $C_S$ and three buses. The conduction paths of transistor $T_4$ and $T_5$ are connected in series between node $P_1$ and bus S-D. The conduction paths of transistors $T_6$ and $T_7$ are connected in series between the same two points. Capacitor $C_S$ is connected between the gate and drain electrodes of transistor $t_6$. The drain electrode of transistor $T_6$ is also connected to the gate electrode of transistor $T_5$. Bus +S-D is connected to the gate electrode of transistor $T_7$. Bus IN is connected to the gate electrode of transistor $T_6$. Bus OUT is connected to the gate electrode of transistor $T_4$.

Figure 7:
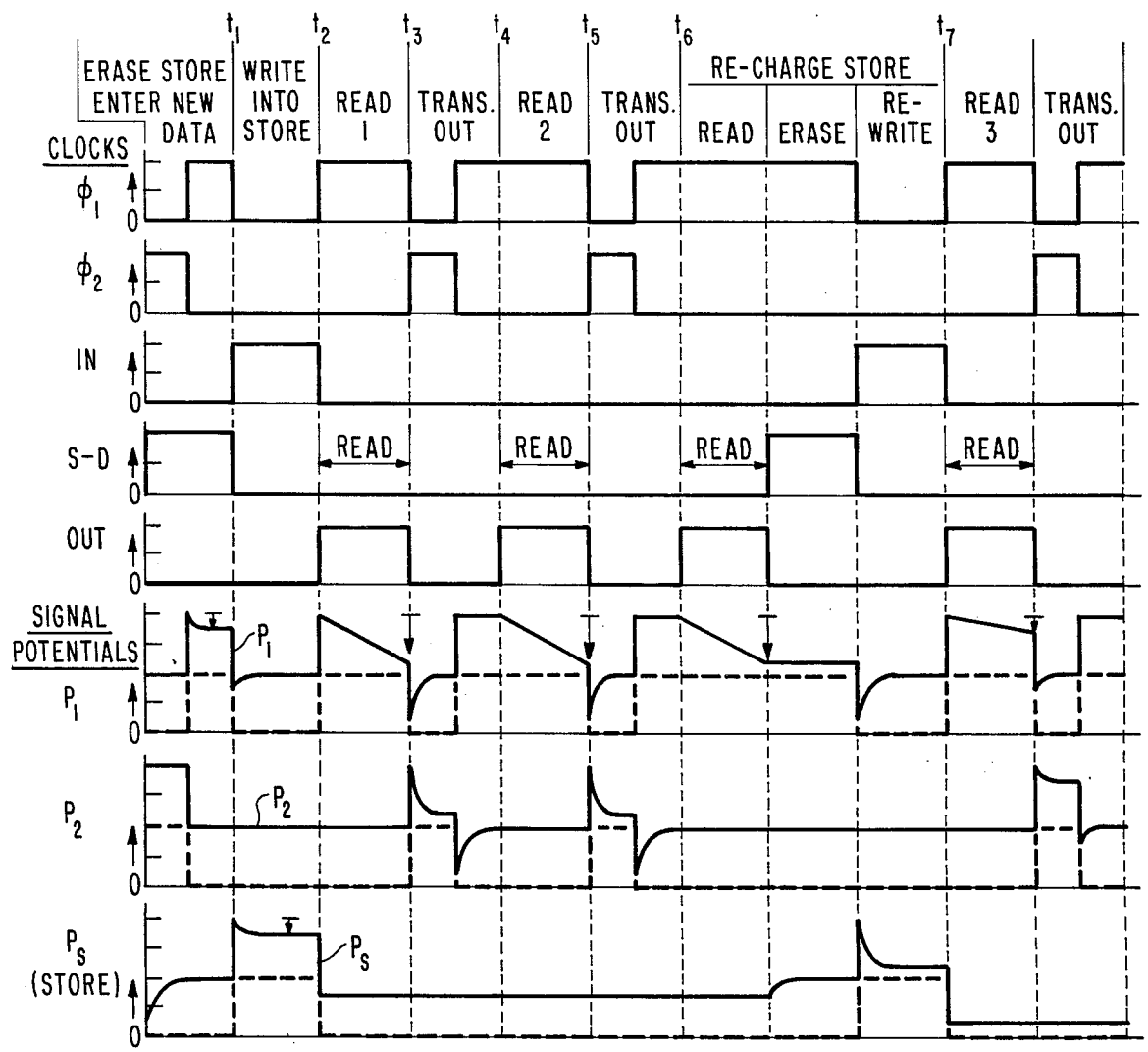
FIG. 7 is a drawing of waveforms to help explain the operation of the circuit of FIG. 6.

The operation of the circuit of FIG. 6 is depicted in FIG. 7. New data is entered into the bucket brigade register in the conventional way. The old information stored at $P_S$ is erased by making S-D positive. This connects node $P_S$ to bus S-D through conducting transistor $T_7$ and node $P_S$ therefore is reset to this positive potential.

Assume now that the new information is present in the bucket-brigade register and is desired to write the charge at $P_1$ into the store ST. This is accomplished by making IN positive and making $\phi_1$ relatively negative (actually returning it to ground potential). $\phi_2$ is also at ground at this time. When IN goes positive, transistor $T_6$ turns on and electrons flow from node $P_1$ to node $P_S$ as shown in FIG. 7. Node $P_S$ initially (at the beginning of interval $t_1$–$t_2$) is at a voltage level $2V_{S-D}$, where $V_{S-D}$ is the maximum positive voltage of bus S-D. Upon the transfer of charge (electrons) from $P_1$ to $P_S$, the voltage at $P_S$ reduces in an amount corresponding to the amount of charge transferred.

A read operation is depicted in FIG. 7 during the period $t_2$ to $t_3$. To obtain readout, OUT is made positive and this turns on transistor $T_4$. Transistor $T_5$ already is on and conducts to an extent determined by the amount of charge stored at $P_S$, the smaller the charge, the greater the conduction through transistor $T_5$. When transistors $T_4$ and $T_5$ conduct, electrons flow from bus S-D which is at ground level to node $P_1$ which is relatively positive, as $\phi_1$ is positive during the read interval. It should be clear from this explanation that the charge returned to node $P_1$ is the complement of the charge stored at $P_S$.

The READ 1 operation shown in FIG. 7 can occur immediately after the WRITE INTO STORE operation as the bucket brigade register has been empited during the process of writing into the store. However, in general, the read operation can occur anytime after the bucket brigade register has been emptied and the register may be emptied simply by shifting its contents out of the register by the successive application of $\phi_1$ and $\phi_2$ shift pulses.

After a read operation, the complementary signals read from the store ST may be transferred out of the register. This is illustrated in FIG. 7 schematically by showing only a single cycle of the multiple phase voltages during the period $t_3$–$t_4$. It is to be understood, of course, that multiple cycles of such voltages will be required, the number of such cycles depending upon the number of stages. It is also to be understood that if it is desired to duplicate rather than to obtain the complement of the stored signal; this readily can be done in the arrangement of FIG. 6. However, it requires inverting the polarity of the stored signal by refreshing it as described in the next paragraph.

The charge stored at $P_S$ may be refreshed at any time desired. A refresh cycle is illustrated in FIG. 7 for the period $t_6$ to $t_7$. The refresh cycle starts by making OUT positive and $\phi_1$ positive while S-D is at ground. This causes transistor $T_4$ to go on and node $P_1$ to become charged via transistors $T_5$ and $T_4$ to a level complementary to that of the charge stored at $P_S$. Next, node $P_S$ is erased by making S-D positive while OUT and IN are at ground level. This returns node $P_S$ to the positive reference voltage level on bus S-D. Next S-D is returned to ground while IN is made positive and $\phi_1$ is returned to ground. This results in the transfer of the complementary charge from node $P_1$ to node $P_S$ in the manner already described. Accordingly, at the end of this cycle, the charge at node $P_S$ is now refreshed with the complement of its original value, without requiring the charge to be circulated throughout the whole register.

An interesting aspect of the circuit of FIG. 6 is that the bucket brigade capacitor $C_1$ serves a dual function. One is the normal one of storing the charge being transferred down the bucket brigade register. The other is as part of the refresh loop. Another interesting aspect of the circuit of FIG. 6 is that the bus S-D serves alternately as a source for charge carriers (during the REWRITE portion of the refresh cycle and during the making of a copy) and as a drain for charge carriers (during any erase operation).

If desired, a refresh cycle can be performed before each readout to insure the highest quality output signals for each copy. The signal gain at transistor $T_5$ can be adjusted (by control of the potential on the S-D bus) so that the digital information is perfectly restored on each recycle. In this case successive readouts of the register will have opposite polarities. Alternatively, refreshing can be performed only as often as actually needed. For example, after each fixed period of time in the range say of less than 100 to several hundred milliseconds (or longer) the bucket brigade register may be emptied and a refreshing operation such as shown in the period $t_6$ to $t_7$ completed.

Figure 8:
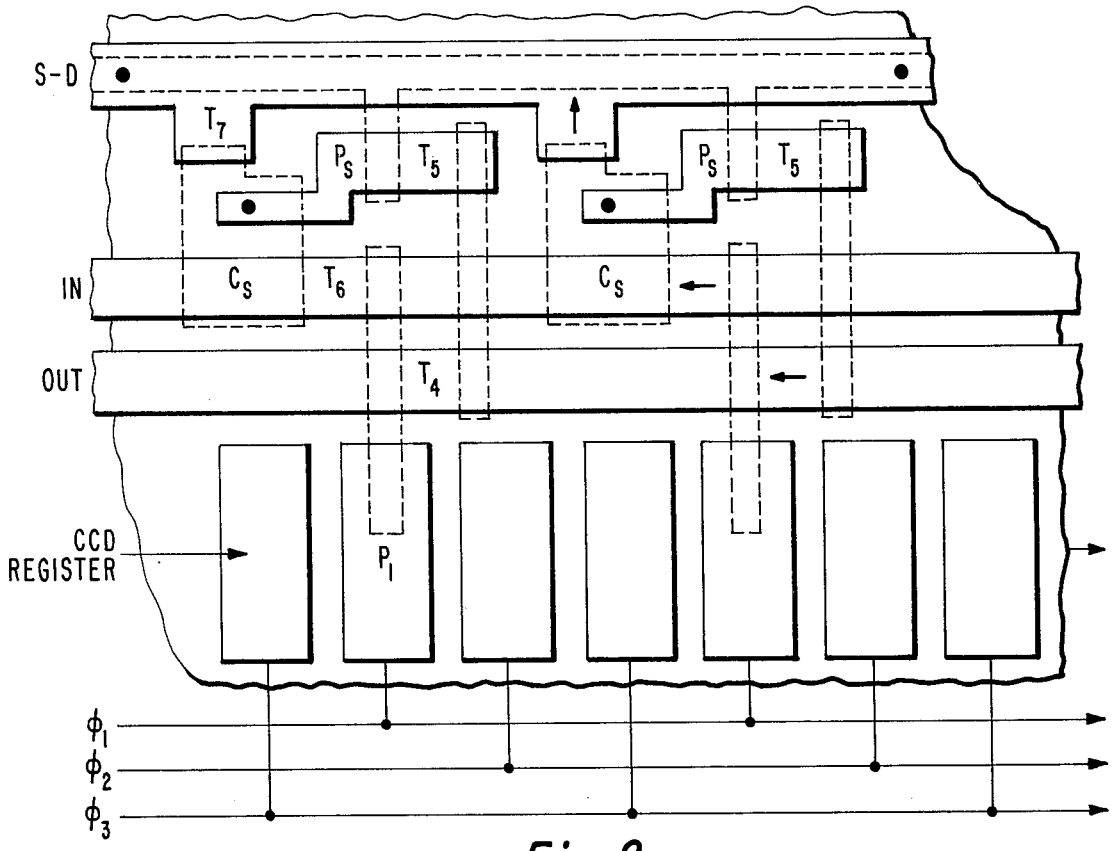
FIG. 8 is a plan view of a modified form of the circuit of FIG. 6.

As stated in the introductory portion of this specification, the circuits of the present invention are equally applicable to both bucket brigade and CCD devices. CCD's are preferably over bucket brigade circuits for long registers as the transfer losses are relatively lower for CCD registers. FIG. 8 illustrates the circuit of FIG. 6 with a CCD register rather than a bucket brigade register. The CCD register is conventional and is a three phase operated register. The dashed regions in FIG. 8 represent diffusions in the substrate of opposite conductivity to that of the substrate. In the present example, the transistors are N channel devices, that is, the substrate is formed of P type material. The isolated dots in FIG. 8 represent direct connections between an overlying conductor which is insulated from the substrate and a diffusion beneath that conductor. The conductor may be a material such as aluminum or polysilicon, as examples. The operation of the FIG. 8 circuit is similar to that of FIG. 6 and need not be discussed in detail.

While not illustrated, it is to be understood that it is also possible to replace portions of the store ST by equivalent CCD stages. However, as extremely low transfer losses are not required here and as the resulting gate electrode cross-over problems would be more severe for the CCD storage elements ST than for the bucket brigade stages illustrated, the latter appear to be more suitable.

Figure 9:
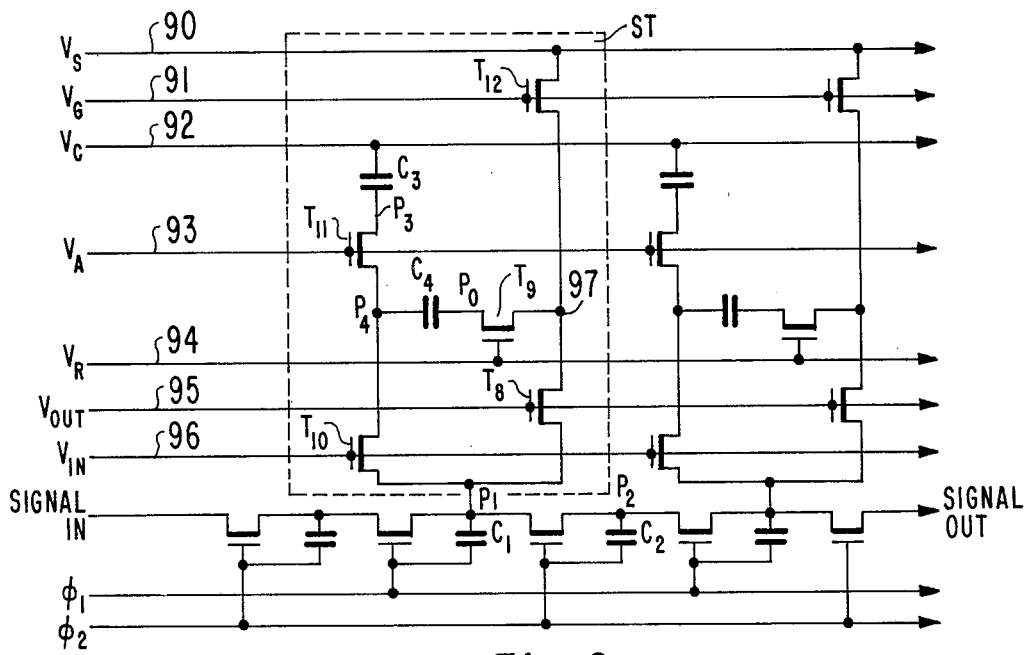
FIG. 9 is a schematic circuit diagram of a number of memory locations in accordance with another embodiment of the invention.

As already mentioned, the circuit of FIG. 6 (and the one of FIG. 8) is especially suitable for digital applications. If operated in analog fashion, the non-linearity of the drain current gate voltage characteristic of the transistor $T_5$ and the variations in threshold voltage, transconductance and gate capacitance of transistor $T_5$ may cause problems. In the circuit of FIG. 9, such effects are substantially reduced. Such reduction is achieved by using the same physical capacitor for charge storage in the storage element and as a source of charge in the output circuit in the manner discussed in detail below, thereby avoiding dependence of the output signal amplitude upon the size of the storage capacitance.

In the circuit of FIG. 9, the store ST comprises five transistors $T_8$ through $T_{12}$ and two capacitors $C_3$ and $C_4$. The conduction paths of transistors $T_8$ and $T_{12}$ are connected in series between node $P_1$ and bus 90. The conduction paths of transistors $T_{10}$ and $T_{11}$ are connected in series between node $P_1$ and node $P_3$. Capacitor $C_3$ is connected between node $P_3$ and bus 92. The conduction path of transistor $T_9$ is connected between node 97 and node $P_O$ and capacitor $C_4$ is connected between node $P_O$ and node $P_4$. The gate electrode of transistor $T_{12}$ is connected to bus 91. The gate electrode of transistor $T_{11}$ is connected to bus 93. The gate electrode of transistor $T_9$ is connected to bus 94. The gate electrode of transistor $T_8$ is connected to bus 95. The gate electrode of transistor $T_{10}$ connected to bus 96.

Figure 10:
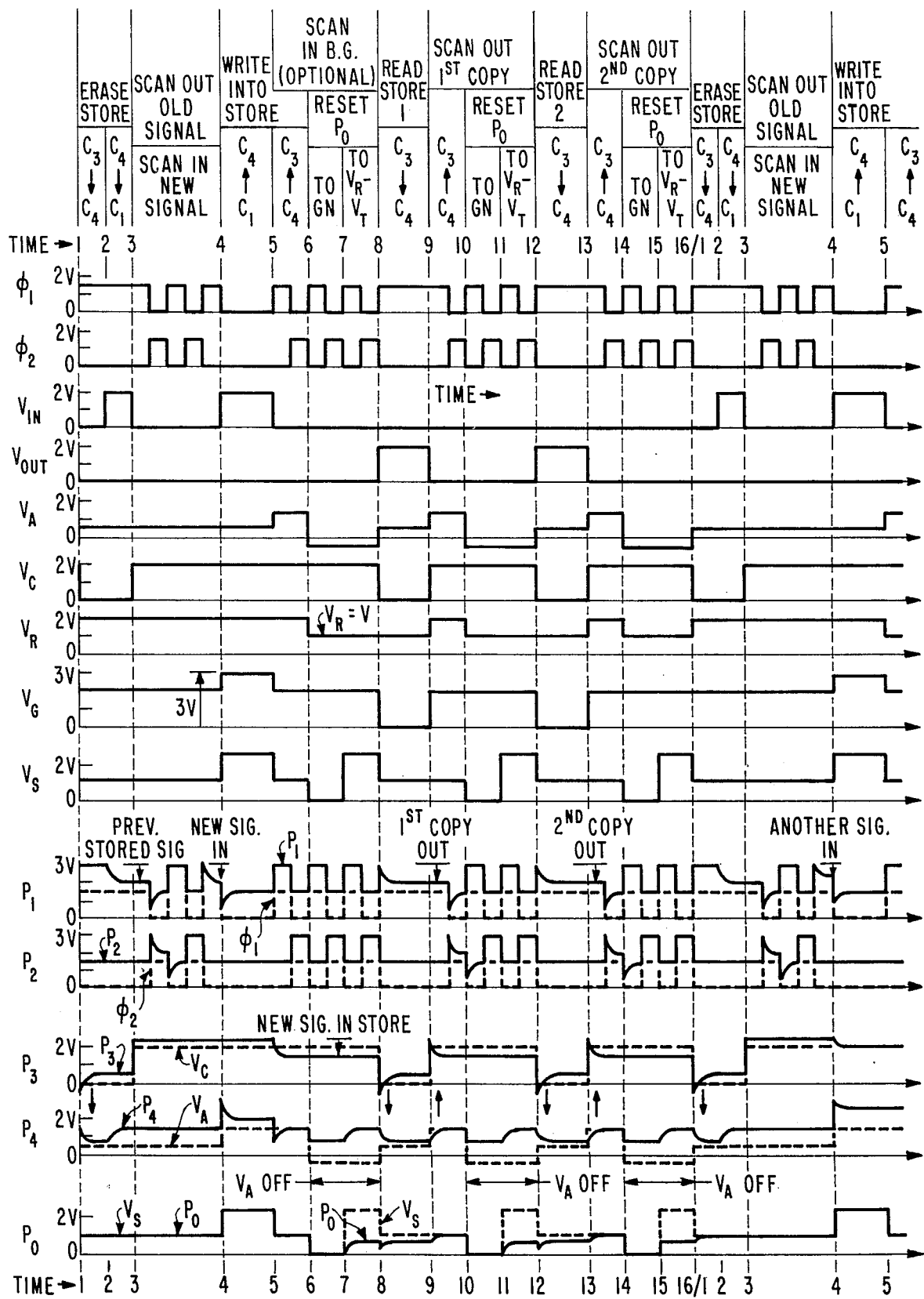
FIG. 10 is a drawing of waveforms to help explain the operation of the circuit of FIG. 9.

The operation of the circuit of FIG. 9 is shown in FIG. 10. The store ST is erased during the period 1–3. First $V_C$ is made relatively negative while $V_A$ is relatively positive to transfer the charge stored in capacitor $C_3$ to capacitor $C_4$. Then while $V_C$ still relatively negative, $V_{IN}$ is made positive to transfer the charge stored in capacitor $C_4$ to node $P_1$. Thereafter, during the period 3–4 the old signals just transferred to the bucket brigade register nodes $P_1$ are transferred out of the bucket brigade register by the multiple phase voltages $\phi_1, \phi_2$. Concurrently, new signals may be read into the bucket brigade register. By the time 4 it is assumed that the bucket brigade register is full.

The writing of new information into the store occurs during the period 4–6. During the period 4–5, $\phi_1$ and $\phi_2$ are both at ground and $V_{IN}$ goes high. At the same time $V_G$ is high (at a level 3V) turning on transistor $T_{12}$; $V_S$ is high (at a level greater than 2V) and $V_R$ is high (at a level 2V) turning on transistor $T_9$. Accordingly, node $P_O$ is placed at a voltage level somewhat greater than 2V, that is, at a level close to the value of the voltage on bus 90. As node $P_O$ is positive and as transistor $T_{10}$ is on, charge (electrons) transfer from node $P_1$ to node $P_4$.

At time 5, $V_{IN}$ returns to ground level cutting off transistor $T_{10}$. $V_{OUT}$ is also at ground level so that transistor $T_8$ is also cut off. Therefore, if desired, a new set of signals, or a uniform background signal, may be scanned into the bucket brigade register. Such scan-in, if performed, would take place during the period 5–8.

During the period 5–6, $V_A$ goes high (to the level +2V). At this same time $V_C$ is high (at the level 2V). $V_G$ has reduced in value to 2V and $V_S$ to V. Accordingly, there is conduction of electrons through transistors $T_9$ and $T_{12}$ from bus 90, and node $P_O$ returns to level V, the voltage on bus 90. At the same time the electrons at node $P_4$ pass to node $P_3$ through transistor $T_{11}$, that is, the charge stored in capacitor $C_4$ is transferred to capacitor $C_3$.

After the above transfer takes place, node $P_O$ is reset. This occurs during the period 6–8. $V_S$ returns to ground during the period 6–7. $V_R$ is at a voltage level V. $V_G$ is at a voltage level 2V. The result is the flow of electrons to node $P_O$, reducing the voltage at node $P_O$ to ground level. During the following period 7–8, $V_S$ changes its level to 2V while $V_R$ remains at V and $V_G$ remains at 2V so that $P_O$ increases in potential almost to V (the difference being the threshold voltage $V_T$ of transistor $T_9$).

After node $P_O$ has been reset as described above, the store ST may be read. This is accomplished during the period 8–9. $V_A$ is raised in potential to a value somewhat lower than +V at the same time $V_C$ is dropped in potential to ground. This causes a transfer of charge from node $P_3$ to $P_4$. $V_R$ remains at level V so that transistor $T_9$ is on. $V_{OUT}$ goes positive to the level 2V. $V_G$ is at ground level turning off transistor $T_{12}$. Accordingly, the charge at node $P_O$ is caused to transfer through the conduction paths of transistor $T_9$ and $T_8$ to node $P_1$ (note that $\phi_1$ is positive at this time). The amount of charge which is transferred to node $P_1$ will depend, of course on the amount of charge which reached node $P_4$ from $P_3$. Note that during the read out process, the initial charge (now at $P_4$) is not disturbed. This charge merely was shuttled first from $P_4$ to $P_3$ and then back to $P_4$ without being altered in the process. Note also that differences in the threshold voltages $V_T$ of transistor $T_9$ from one location to the next will have no effect on the total charge transferred from $P_O$ to $P_1$ during the read period because the current is cut off when $P_O$ is raised to the same potential $V_R$–$V_T$ to which it had been set during the preceding reset period. In other words, transistor $T_9$ operates as a source-follower with the same threshold in both periods so that the actual value of $V_T$ cancels out. Variations in the threshold voltage of transistor $T_8$ from one store to the next do not affect the uniformity of the copies made either because transistor $T_8$ is "full on" during readout. In other words, the gate electrode of this transistor is at +2V, which is far removed from the threshold $V_T$ of this transistor. The threshold voltage of transistor $T_{12}$ does not affect the uniformity of the copies either for similar reasons.

After the first copy is made, that is, after the first copy is read from the stores ST and stored in the bucket brigade register, it is shifted out of the register. This occurs during the period 9–12. During this same time, first the charge in capacitance $C_4$ is returned to capacitance $C_3$. This is accomplished by making $V_A$ positive and adjusting other of the voltages in the manner already discussed. This transfer takes place during the period 9–10. Then $P_O$ is reset to ground by placing bus 90 at ground and applying appropriate voltages to the gate electrodes of transistors $T_9$ and $T_{12}$ to form a low impedance conduction path between node $P_O$ and bus 90. This already has been discussed. Thereafter in the period 11–12 potential at $P_O$ is raised to the level $V_R$–$V_T$ in the manner also already discussed. The circuit is now ready for the next copy to be made. The remainder of FIG. 10 is believed to be self-explanatory from the discussion already given.

It should be noted that the resetting of node $P_O$ via a transistor ($T_9$ of FIG. 9) having a non zero threshold voltage has no degrading effect on the transfer of signal between capacitors $C_4$ and $C_3$. It may be observed that in order to reset $P_O$ prior to each readout, node $P_O$ is first charged negatively to zero volts in the manner already discussed and then allowed to rise to the pinch-off voltage $V_{RT}=(V_R-V_T)$ by source-follower action as in a bucket brigade circuit. To avoid having a large flow of electrons from node $P_4$ to node $P_3$ when node $P_O$ is at ground, the $V_A$ voltage is also placed at ground level during a period such as 10–11. The voltage excursions of $V_C$, $V_A$ and $P_O$ do not impede the flow of charge from $C_3$ to $C_4$ during the period 12–13 or from $C_4$ to $C_3$ during the period 13–14.

Figure 12:
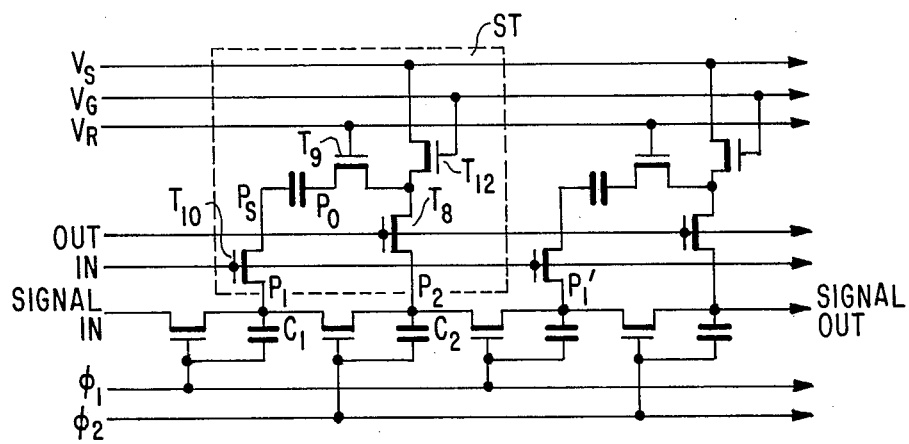
FIG. 12 is a schematic circuit diagram of another embodiment of the invention.

The "charge-duplicating" analog storage stysem shown in FIG. 9 requires five transistors and two capacitors at each store ST, plus seven bus-bars for controlling the operation of these components during the write in to and the read-out from the store. FIG. 12 shows a modified store ST which is substantially equivalent to that of FIG. 9 in performance and is simpler in construction. The modified store has four transistors, one capacitor and requires five bus-bars for operation. The resulting economy in fabrication has been achieved by means of an added tap connection to the register which permits the stored charge to be temporarily held in one of the register capacitors during the reset of $P_O$. Thus capacitor $C_3$ and transistor $T_{11}$ of FIG. 9 with their respective bus-bars $V_C$ and $V_A$ are eliminated, and their functions are carried out by the register capacitor $C_2$ and the input transistor $T_{10}$. The only disadvantage of this modification is the more precise construction required to make two taps to each stage of the charge transfer register, instead of just one as in FIG. 9.

Figure 13:
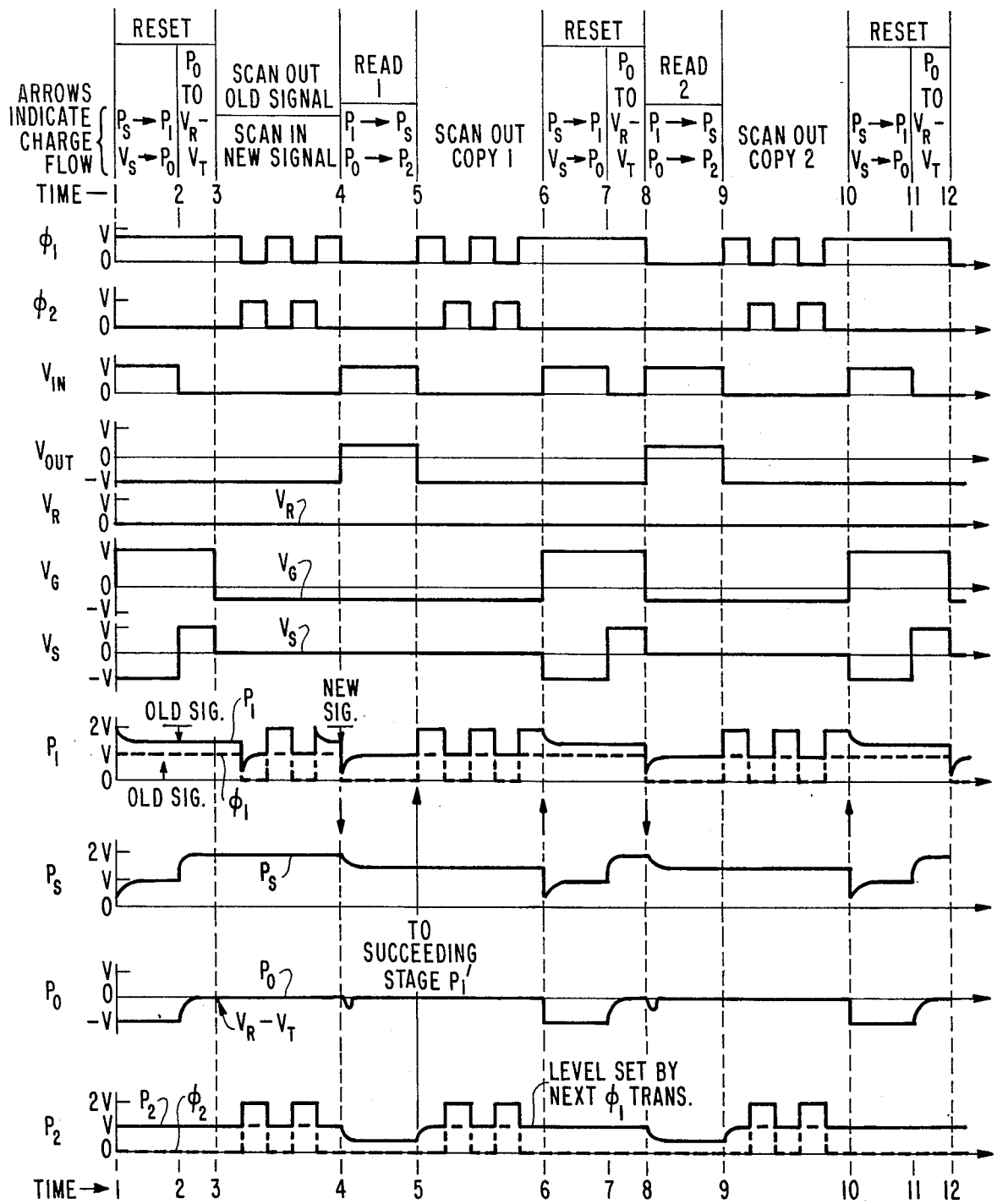
FIG. 13 is a drawing of waveforms to help explain the operation of the circuit of FIG. 12.

The detailed operation of FIG. 12 should be clear from the waveforms shown in FIG. 13. During the time interval 1–2, unwanted signal stored on $P_S$ is transferred to $P_1$ at the same time electrons are restored to $P_O$ from $V_S$ preliminary to resetting of $P_O$. During time 2–3, $P_O$ is reset to potential $V_R$–$V_T$, where $V_T$ is the threshold potential of the transistor $T_9$ connected to the $V_R$ bus. The gate electrode of transistor $T_9$ is held at ground potential for reasons discussed below. Since both the IN and OUT transistors $T_{10}$ and $T_8$, respectively, are off during the period 3–4, the unwanted signal which had been transferred to $P_1$ can now be scanned out of the register while new signal is being scanned in to take its place. During interval 4–5, the new signal is transferred from $P_1$ to $P_S$, and at the same time a first copy of the new signal is returned to $P_2$. The first copy is scanned out of the register during 5–6 while the original charge is retained at $P_S$.

Readout of a second copy requires $P_O$ to be reset by the same two-step process used during the interval 1–3. Electrons are restored to $P_O$ from $V_S$ during 6–7 while at the same time the stored charge is moved back temporarily to $P_1$ in the register. Since $P_O$ will serve as the source of electrons for the copied signal which will enter the register at $P_2$ it is necessary to hold the transistor $T_9$ gate potential $V_R$ at ground potential. To restore electrons to $P_O$ prior to reset, the bus $V_S$ must be made negative during the interval from 6–7. (The substrate should be kept biased to approximately $-V$ volts to avoid forward-biasing the diffused N+ electrodes when they are made negative.) Reset of $P_O$ during 7–8 brings its potential up to $V_R$–$V_T$, or $-V_T$ volts in this case since $V_R$ is at ground. Upon transfer of the stored charge back to $P_S$ during the read process from 8–9, the potential at $P_O$ is momentarily driven negative, causing an equal amount of charge to pass through the $V_R$ transistor before the potential of $P_O$ again rises to $-V_T$ volts where the current is cut off. By making $V_R$ at ground potential (instead of +V) it became possible to transfer the copy into $P_2$ while maintaining $\phi_2$ at ground so that the original stored charge on $P_1$ did not pass directly from $P_1$ to $P_2$ through the register as it would have if $\phi_2$ had been at +V.

As in the preceding example, analog signals can be read many times from the storage element of FIG. 12 without diminishing the signal by the read out process. The readout can continue until natural leakage in the reverse-biased transistors has degraded the signal to unacceptable values.

Although the circuit of FIG. 12 operates in the same general manner as the circuit of FIG. 9, it contains the additional feature (aside from fewer elements) that one stage of the readout register is used alternately as a repository for the stored charge during the copying process. This feature leads to economy in use of silicon for fabrication of large arrays. So far as is known, this is the first instance where charge is being removed from one half-stage of a register while a copy of the same charge is being introduced into the next half-stage of the same register.

While the invention has been illustrated in terms of self-scanned registers or arrays, it is to be understood that the use of a common capacitor in the manner described can be extended to other situations where it is desired to reproduce charge patterns in parallel without disturbing the original. For example, the reciprocating stores illustrated in FIG. 6 may be replaced by circulating loops of from one to N stages or by a continuous input register running parallel to the output register. In this latter case, the stores may receive data from the input register and provide copies in parallel to the output register during one period of time and then each register can be run independently, at different speeds, if desired. An analog storage system such as illustrated in FIG. 6 with a sufficient number of locations to provide full TV resolution would be able to serve some of the same functions as a storage tube. For example, it can be used for storage of background correction signals for making more uniform the output signal from an image sensor with minimum interruption of the useful signal to obtain the correcting signal. The storage array can be entirely separate from the sensor or it can be interleaved with the photosensitive registers of the sensor. Alternately, the storage element ST of systems such as illustrated in the preceding figures may be made photosensitive and the registers shielded from light. Such an arrangement would permit increased sensitivity by employing long integration times while maintaining normal readout rates without flicker.

WHAT IS CLAIMED IS:

1. A charge transfer storage circuit comprising, in combination:
   a charge transfer stage which includes a node at which charge may be stored;
   a storage element;
   means operative during one time interval for transferring charge from said node to said storage element;
   charge conducting means; and
   means operative during a following time interval for transferring charge between said charge conducting means and said node under control of the charge in said storage element, said means for transferring comprising a transistor having a conduction path and a control electrode for controlling the conductivity of said path, said path being connected between said charge conducting means and said node, and said storage element being connected to said control electrode.

2. A charge transfer circuit as set forth in claim 1 wherein said storage element comprises a capacitor, one element of said capacitor comprising a region in a semiconductor substrate of opposite conductivity to the substrate and the other element of said capacitor comprising conductive means overlying said region and insulated therefrom.

3. A charge transfer circuit as set forth in claim 1 wherein said charge conducting means comprises a drain for charge carriers, and further including means for charging said node with charge carriers prior to the transfer of charge between said node and said conducting means, whereby said node discharges through the conduction path of said transistor to said conducting means to an extent complementary to the charge stored in said storage element.

4. A charge transfer storage circuit as set forth in claim 1 wherein said charge conducting means comprises a conductor and means for placing the same at a potential to operate as a source of charge carriers during the transfer of charge between said charge conducting means and said node, and wherein said transfer of charge takes place after charge has been removed from said node, whereby when said charge transfer takes place via said conduction path, a charge remains stored at said node which is complementary to that in said storage element.

5. A charge transfer storage circuit as set forth in claim 4 further including means for erasing said storage element, said means for erasing comprising means for placing said conducting means at a potential to operate as a drain for charge carriers and means for connecting said conducting means, when at said potential, to said storage element.

6. A charge transfer circuit as set forth in claim 1, further including means responsive to the charge stored in said storage element for providing a refreshed charge and placing the same at said node, means for subsequently removing said charge stored in said storage element, and means responsive to said refreshed charge for transferring a new charge to said storage element.

7. A charge transfer circuit as set forth in claim 6 wherein said means for providing a refreshed charge comprises means for operating said charge conducting means as a source of charge carriers, and means responsive to the charge stored in said storage element for conducting from said conducting means to said node an amount of charge complementary to that stored in said storage element, wherein said means for subsequently removing said charge comprises means for operating said charge conducting means as a drain for charge carriers and means for connecting said conducting means to said storage element for removing the charge stored in the latter and resetting the storage element in the process, and wherein said means for transferring a new charge comprises said conduction path of said transistor.

8. A charge transfer storage circuit comprising, in combination:
   a plurality of charge transfer stages, each including a node at which charge may be stored;
   a like plurality of storage elements, one for each stage; and
   at each location, a circulation loop comprising:
   a. means for transferring the charge at said node at said location to said storage element for that location;
   b. means responsive to the charge at said storage element for inserting a refreshed charge at said node;
   c. means for erasing the charge stored at said storage element; and
   d. means for transferring said refreshed charge from said node to said storage element.

9. A charge transfer storage circuit comprising, in combination:
   a plurality of interconnected charge transfer stages; and
   a like plurality of recirculation loops for locally refreshing the stored charges, one coupled to each stage.

10. A charge transfer storage circuit comprising, in combination:
 a charge transfer stage which includes a node at which charge may be stored;
 first and second charge storage means;
 means for transferring the charge at said node to said first charge storage means;
 a second node;
 a source of charge carriers;
 a controllable charge conduction path connected at one end to said second node;
 means for supplying charge at a reference level to the other end of said conduction path while turning on said conduction path to thereby store a charge at a reference level at said second node;
 means for transferring the charge at said first charge storage means to said second charge storage means;
 means for turning on said conduction path during the transfer of charge from said first to said second storage means; and
 means including means responsive to the charge in said second storage means for transferring from said second to said first node through said conduction path an amount of charge complementary to that stored in said second storage means.

11. A charge transfer circuit as set forth in claim 10 wherein said first and second charge storage means comprise first and second capacitors, respectively.

12. A charge transfer circuit as set forth in claim 11 wherein the means for transferring charge from one storage means to the other comprises a second conduction path connected at one end to one terminal of the first capacitor and at the other end to one terminal of the other capacitor, means for turning on said second conduction path, and means for concurrently changing the voltage level at the other terminal of the first capacitor.

13. A charge transfer circuit as set forth in claim 12 wherein said second node is at the other terminal of said second capacitor.

14. A charge transfer circuit as set forth in claim 13 wherein said means for supplying charge at a reference level to the other end of said first mentioned conduction path comprises;
 a source of charge carriers;
 a third conduction path connected between said source of charge carriers and said other end of said first-mentioned conduction path; and
 means for turning on said third conduction path.

15. In a charge transfer circuit which includes a charge transfer stage having a first node at which charge may be stored and which includes also a second node at which a charge proportional to that at said first node may be stored to permit future copies to be made of charge proportional to that stored at the second node, in combination;
 means for transferring from said first node to said second node the charge stored at said first node;
 a third node;
 a conduction path connected at one end to said third node;
 means for applying charge through said conduction path to said third node for establishing charge at a reference level at said third node; and
 means under the control of the charge stored at said second node for removing from said third node through said conduction path to said first node an amount of charge proportional to that stored at said second node.

16. In the combination as set forth in claim 15, said means for establishing charge at a reference level including means for initially resetting said third node to a standard voltage level.

17. In a charge transfer circuit as set forth in claim 15, said conduction path comprising the conduction path of an MOS transistor.

18. In a charge transfer circuit as set forth in claim 15, further including:
 a fourth node;
 means for transferring charge from said second to said fourth node while said charge is being established at said third node; and
 means for transferring charge from said fourth back to said second node for effecting the removal of charge from said third to said first node.

19. A charge transfer circuit comprising, in combination:
 a charge transfer register including at each stage at least first and second storage elements;
 a third charge transfer element associated with each stage; and
 means at each stage responsive to a control signal manifestation for transferring charge signal from the first storage element of that stage to the third charge transfer element associated with that stage, and for producing a copy of that charge signal and placing it in the second storage element of that stage.

20. A charge transfer circuit as set forth in claim 19 wherein said means at each stage comprises a transistor having a conduction path, means for transferring charge signal in one direction through said conduction path for producing said copy, and means for transferring charge signal in the opposite direction through said conduction path for placing said copy in said second storage element.

21. A charge transfer circuit comprising, in combination:
 a charge transfer register including a plurality of stages;
 means for removing from each stage of the register a charge proportional to that stored at each stage;
 means responsive to a control signal manifestation and to the charge removed from each stage for producing a copy charge proportional thereto, said means including a common charge source and including also at each stage a conduction path, a storage node, and means for transferring charge in one direction from said source through said conduction path to said storage node; and
 means responsive to a control signal manifestation for transferring the copy charge produced at each stage in the opposite direction through said conduction path to said register stage.

* * * * *